(12) United States Patent
Minzoni et al.

(10) Patent No.: US 7,310,010 B2
(45) Date of Patent: Dec. 18, 2007

(54) DUTY CYCLE CORRECTOR (75) Inventors: Alessandro Minzoni, Morrisville, NC (US); Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/403,453

(22) Filed: Apr. 13, 2006

(65) Prior Publication Data

US 2007/0241799 A1    Oct. 18, 2007

(51) Int. Cl.
H03K 3/017    (2006.01)
H03K 5/04     (2006.01)
H03K 7/08     (2006.01)

(52) U.S. Cl. .................. 327/175; 327/172; 327/173; 327/174; 327/141; 327/156; 327/161; 327/162; 327/163

(58) Field of Classification Search ........ 327/172–175, 327/31, 149, 158
See application file for complete search history.

(56) References Cited

U.S. PATENT DOCUMENTS

| | | | |
|---|---|---|---|
| 6,366,115 B1 | 4/2002 | DiTommaso | |
| 6,677,792 B2 | 1/2004 | Kwak | |
| 6,687,844 B1 | 2/2004 | Zhang | |
| 6,765,421 B2 | 7/2004 | Brox et al. | |
| 6,934,215 B2 * | 8/2005 | Chung et al. ............... | 365/233 |
| 7,116,143 B2 * | 10/2006 | Deivasigamani et al. ... | 327/149 |
| 7,142,026 B2 * | 11/2006 | Kwak ......................... | 327/158 |
| 2002/0196887 A1 | 12/2002 | Heikkila | |
| 2003/0219088 A1 | 11/2003 | Kwak | |
| 2004/0027182 A1 | 2/2004 | Brox et al. | |
| 2004/0095174 A1 * | 5/2004 | Hong et al. ................. | 327/175 |
| 2004/0251939 A1 | 12/2004 | Brox et al. | |
| 2004/0257134 A1 | 12/2004 | Minzoni | |
| 2006/0220714 A1 * | 10/2006 | Hur ............................ | 327/175 |
| 2006/0267649 A1 * | 11/2006 | Park et al. ................... | 327/158 |

OTHER PUBLICATIONS

Matano et al., "A 1-Gb/s/pin 512 Mb DDRII SDRAM Using a Digital DLL and a Slew-Rate-Controlled Output Buffer", IEEE Journal of Solid State Circuits, vol. 38, Issue 5, pp. 762-768, May 2003.*

* cited by examiner

Primary Examiner—Linh My Nguyen
Assistant Examiner—Patrick O'Neill
(74) Attorney, Agent, or Firm—Dicke, Billig & Czaja, PLLC (57) ABSTRACT A duty cycle corrector includes a first controllable delay, a second controllable delay, a phase detector, and a compensation circuit. The first controllable delay is configured to delay a first signal to provide a second signal. The second controllable delay is configured to delay the second signal to provide a third signal. The phase detector is configured to adjust the first controllable delay and the second controllable delay to phase lock the third signal to the first signal. The compensation circuit is configured to compensate for a mismatch between the first controllable delay and the second controllable delay to provide a fourth signal in response to the first signal and a fifth signal approximately 180 degrees out of phase with the fourth signal in response to the second signal.

17 Claims, 6 Drawing Sheets

DUTY CYCLE CORRECTOR

BACKGROUND

Many digital circuits receive a clock signal to operate. One type of circuit that receives a clock signal to operate is a memory circuit, such as a Dynamic Random Access Memory (DRAM), Synchronous Dynamic Random Access Memory (SDRAM), or Double Data Rate Synchronous Dynamic Random Access Memory (DDR-SDRAM). In a memory circuit operating at high frequencies, it is important to have a clock signal that has about a 50% duty cycle. This provides the memory circuit with approximately an equal amount of time on the high level phase and on the low level phase for transferring data into and out of the memory circuit, such as latching rising edge data and latching falling edge data out of the memory circuit.

Often, a clock signal is provided by an oscillator, such as a crystal oscillator, and clock circuitry. The oscillator and clock circuitry may provide a clock signal that does not have a 50% duty cycle. For example, the clock signal may have a 45% duty cycle, where the high level phase is 45% of one clock cycle and the low level phase is the remaining 55% of the clock cycle. A duty cycle corrector receives the clock signal and corrects or changes the duty cycle of the clock signal to provide clock signals with transitions separated by substantially one-half of a clock cycle.

For these and other reasons, there is a need for the present invention.

SUMMARY

One embodiment of the present invention provides a duty cycle corrector. The duty cycle corrector includes a first controllable delay, a second controllable delay, a phase detector, and a compensation circuit. The first controllable delay is configured to delay a first signal to provide a second signal. The second controllable delay is configured to delay the second signal to provide a third signal. The phase detector is configured to adjust the first controllable delay and the second controllable delay to phase lock the third signal to the first signal. The compensation circuit is configured to compensate for a mismatch between the first controllable delay and the second controllable delay to provide a fourth signal in response to the first signal and a fifth signal approximately 180 degrees out of phase with the fourth signal in response to the second signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
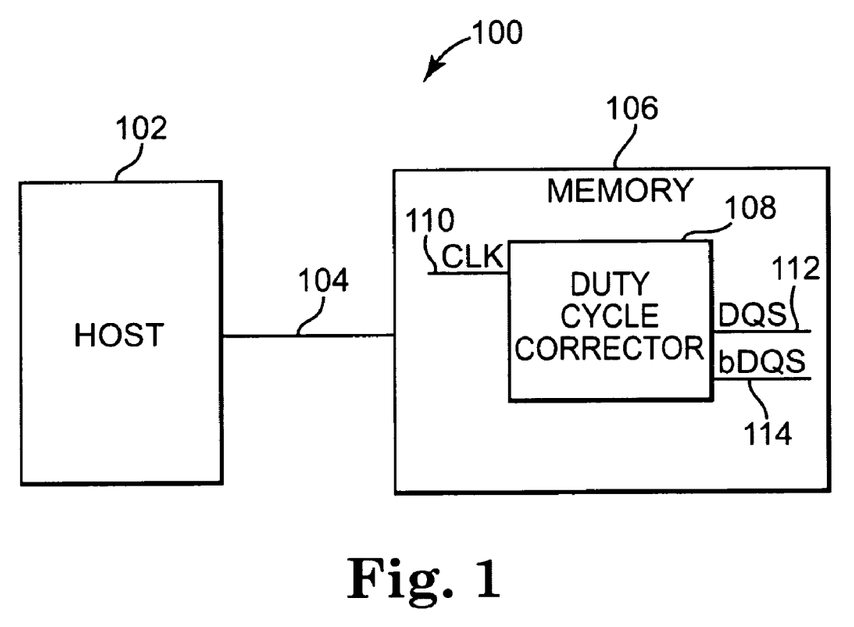
FIG. 1 is a block diagram illustrating one embodiment of an electronic system.

FIG. 1 is a block diagram illustrating one embodiment of an electronic system 100 according to the present invention. Electronic system 100 includes a host 102 and a memory circuit 106. Host 102 is electrically coupled to memory circuit 106 through memory communications path 104. Host 102 is any suitable electronic host, such as a computer system including a microprocessor or a microcontroller. Memory circuit 106 is any suitable memory, such as a memory that utilizes a clock signal to operate. In one embodiment, memory circuit 106 includes a Random Access Memory (RAM), such as a Dynamic Random Access Memory (DRAM), Synchronous Dynamic Random Access Memory (SDRAM), or Double Data Rate Synchronous Dynamic Random Access Memory (DDR-SDRAM).

Memory circuit 106 includes a duty cycle corrector 108. Duty cycle corrector 108 includes a circuit configured to compensate for variations between controllable delays within duty cycle corrector 108 and for variations in intrinsic delays within duty cycle corrector 108. The variations, if left uncompensated, may result in the duty cycle corrector failing to provide output signals having duty cycles of substantially 50%. The compensation includes additional delays that are set based on a phase difference between two test mode signals output by the duty cycle corrector in a test mode.

Duty cycle corrector 108 receives a clock (CLK) signal on CLK signal path 110. In one embodiment, duty cycle corrector 108 receives an external clock signal from host 102 on CLK signal path 110 through memory communications path 104. In other embodiments, duty cycle corrector 108 receives an external clock signal on CLK signal path 110 from any suitable device, such as a dedicated clock circuit that is located inside or outside memory circuit 106.

Duty cycle corrector 106 provides a data strobe (DQS) signal on DQS signal path 112 and an inverted data strobe (bDQS) signal on bDQS signal path 114. The DQS signal on DQS signal path 112 has a duty cycle of approximately 50%, and the bDQS signal on bDQS signal path 114 has a duty cycle of approximately 50%. The bDQS signal is the inverse of the DQS signal. Duty cycle corrector 108 receives the CLK signal on CLK signal path 110, which may not have a 50% duty cycle, and provides the DQS signal on DQS signal path 112 and the bDQS signal on bDQS signal path 114, which have duty cycles of substantially 50%. Data is transferred into and/or out of memory circuit 106 in response to the DQS signal and the bDQS signal.

Figure 2:
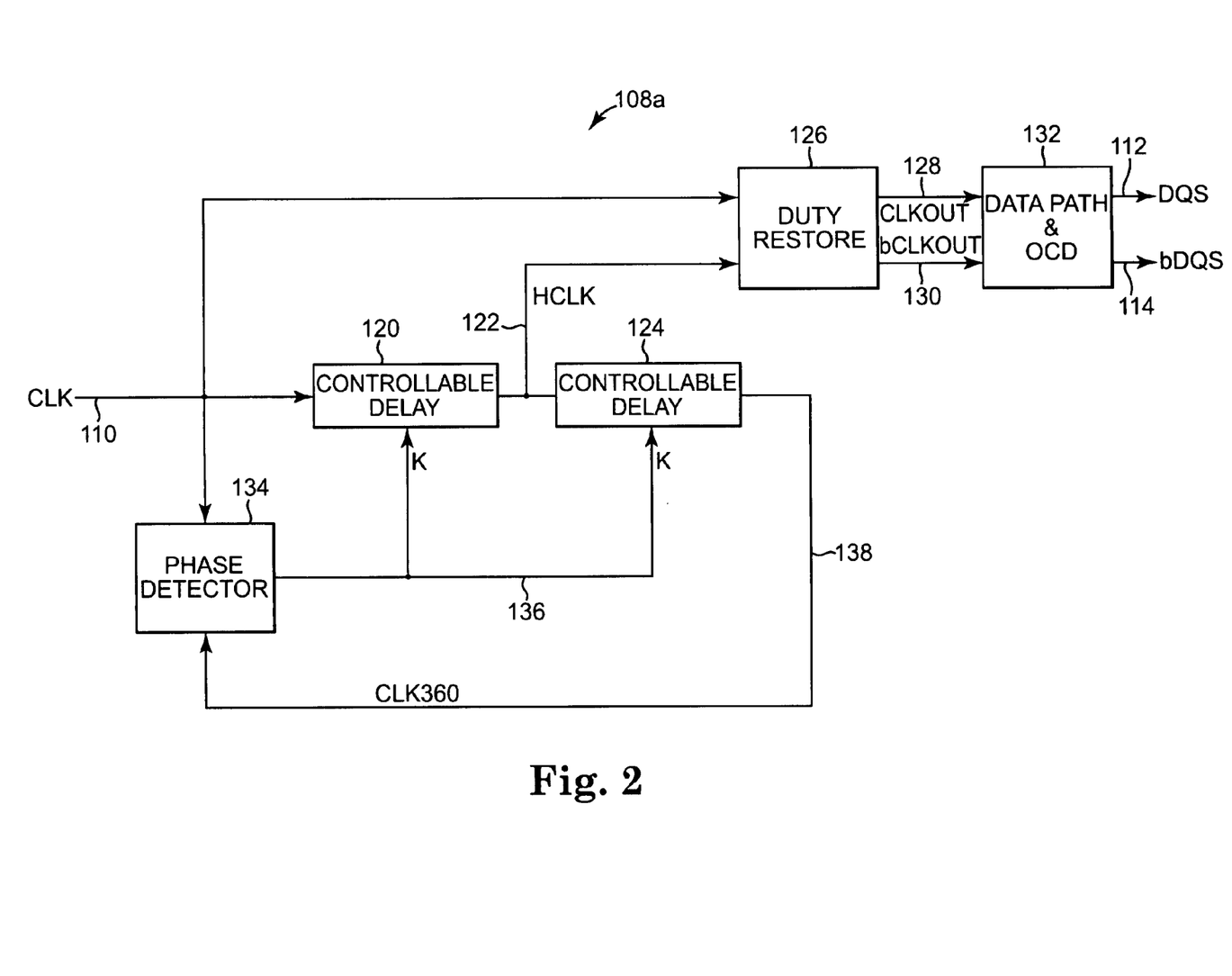
FIG. 2 is a block diagram illustrating one embodiment of a duty cycle corrector.

FIG. 2 is a block diagram illustrating one embodiment of a duty cycle corrector 108a. Duty cycle corrector 108a includes phase detector 134, controllable delay 120, controllable delay 124, duty restore circuit 126, and data path and off chip driver (OCD) circuit 132. A first input of duty restore circuit 126, the input of controllable delay 120, and a first input of phase detector 134 receive the CLK signal on CLK signal path 110. The output of controllable delay 120 is electrically coupled to a second input of duty restore circuit 126 and the input of controllable delay 124 through half clock (HCLK) signal path 122. The output of controllable delay 124 is electrically coupled to a second input of phase detector 134 through clock 360 (CLK360) signal path 138.

The output of phase detector 134 is electrically coupled to the control input of controllable delay 120 and the control input of controllable delay 124 through K signal path 136. A first output of duty restore circuit 126 is electrically coupled to a first input of data path and OCD circuit 132 through clock out (CLKOUT) signal path 128. A second output of duty restore circuit 126 is electrically coupled to a second input of data path and OCD circuit 132 through inverted clock out (bCLKOUT) signal path 130. Data path and OCD circuit 132 provides the DQS signal on DQS signal path 112 and the bDQS signal on bDQS signal path 114.

Controllable delay 120 delays the CLK signal on CLK signal path 110 to provide the HCLK signal on HCLK signal path 122. The HCLK signal is approximately 180 degrees out of phase with the CLK signal. The delay of controllable delay 120 is selected based on the K control signal input to controllable delay 120 on K signal path 136. Controllable delay 120 is any suitable type of variable delay, such as a series of inverters switched by the K control signal input.

Controllable delay 124 delays the HCLK signal on HCLK signal path 122 to provide the CLK360 signal on CLK360 signal path 138. The CLK360 signal is approximately 180 degrees out of phase with the HCLK signal. The delay of controllable delay 124 is selected based on the K control signal input to controllable delay 124 on K signal path 136. Controllable delay 124 is any suitable type of variable delay, such as a series of inverters switched by the K control signal input. In one embodiment, controllable delay 124 is similar to controllable delay 120.

Phase detector 134 receives the CLK signal on CLK signal path 110 and the CLK360 signal on CLK360 signal path 138 to provide the K control signal on K signal path 136. Phase detector 134 determines the phase difference between the CLK signal and the CLK360 signal to provide the K control signal on K signal path 136. Phase detector 134 provides the K control signal on K signal path 136 to adjust the delay of controllable delay 120 and the delay of controllable delay 124 such that the CLK360 signal is phase-locked to the CLK signal. In one embodiment, the delay of controllable delay 120 and the delay of controllable delay 124 are equal.

Duty restore circuit 126 receives the CLK signal on CLK signal path 110 and the HCLK signal on HCLK signal path 122 to provide the CLKOUT signal on CLKOUT signal path 128 and the bCLKOUT signal on bCLKOUT signal path 130. In response to a rising edge of the CLK signal, duty restore circuit 126 transitions the CLKOUT signal from logic low to logic high and transitions the bCLKOUT signal from logic high to logic low. In response to a rising edge of the HCLK signal, duty restore circuit 126 transitions the CLKOUT signal from logic high to logic low and transitions the bCLKOUT signal from logic low to logic high. The bCLKOUT signal is the inverse of the CLKOUT signal.

Data path and OCD circuit 132 receives the CLKOUT signal on CLKOUT signal path 128 and the bCLKOUT signal on bCLKOUT signal path 130 to provide the DQS signal on DQS signal path 112 and the bDQS signal on bDQS signal path 114. Data path and OCD circuit 132 includes drivers for generating the DQS and bDQS signals in response to the CLKOUT and bCLKOUT signals. Data path and OCD circuit 132 includes intrinsic delays through the data path and OCD.

In operation, the CLK signal is delayed by controllable delay 120 to provide the HCLK signal. The HCLK signal is delayed by controllable delay 124 to provide the CLK360 signal. The CLK signal and CLK360 signals are input to phase detector 134. Phase detector 134 compares the CLK signal to the CLK360 signal to determine the phase difference between the CLK signal and the CLK360 signal. Phase detector 134 provides the K control signal to controllable delay 120 and controllable delay 124 to adjust the delay of controllable delay 120 and the delay of controllable delay 124 to phase lock the CLK360 signal to the CLK signal. In response to the CLK signal and the HCLK signal, duty restore circuit 126 provides the CLKOUT signal having a duty cycle of substantially 50% and the bCLKOUT signal having a duty cycle of substantially 50%. In response to the CLKOUT signal and the bCLKOUT signal, data path and OCD circuit 132 generates the DQS and bDQS signals.

Figure 3:
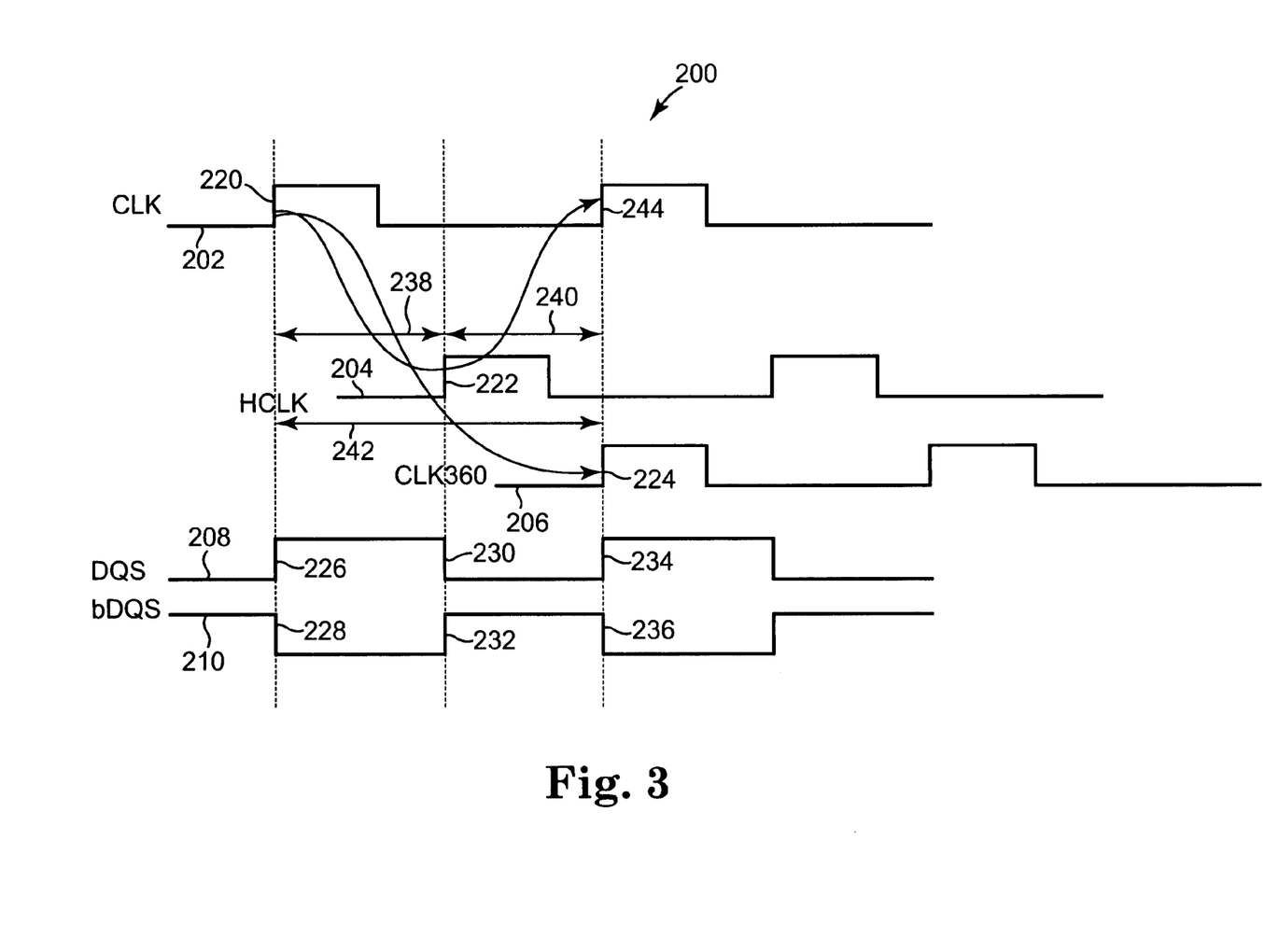
FIG. 3 is a timing diagram illustrating one embodiment of the timing of signals for the duty cycle corrector.

FIG. 3 is a timing diagram 200 illustrating one embodiment of the timing of signals for duty cycle corrector 108a. In this embodiment, the delay of controllable delay 120 and the delay of controller delay 124 are substantially equal. In addition, the intrinsic delay of the CLK signal to generate the DQS signal and the intrinsic delay of the HCLK signal to generate the bDQS signal through duty restore circuit 126 and data path and OCD circuit 132 are substantially equal.

Timing diagram 200 includes CLK signal 202 on CLK signal path 110, HCLK signal 204 on HCLK signal path 122, CLK360 signal 206 on CLK360 signal path 138, DQS signal 208 on DQS signal path 112, and bDQS signal 210 on bDQS signal path 114. The duty cycle of CLK signal 202 is less than 50%. Rising edge 220 of CLK signal 202 is delayed by controllable delay 120 to provide rising edge 222 of HCLK signal 204. The delay of controllable delay 120 is one half cycle of CLK signal 202 as indicated at 238. Rising edge 222 of HCLK signal 204 is delayed by controllable delay 124 to provide rising edge 224 of CLK360 signal 206. The delay of controllable delay 124 is one half of the cycle of CLK signal 202 as indicated at 240. The delay of controllable delay 124 indicated at 240 is substantially equal to the delay of controllable delay 120 indicated at 238.

The total delay between rising edge 220 of CLK signal 202 and rising edge 224 of CLK360 signal 206 is one clock cycle as indicated at 242. Phase detector 134 adjusts controllable delay 120 and controllable delay 124 to phase lock CLK360 signal 206 to CLK signal 202 such that rising edge 224 of CLK360 signal 206 is aligned with rising edge 244 of CLK signal 202.

In response to rising edge 220 of CLK signal 202, duty restore circuit 126 and data path and OCD circuit 132 provide rising edge 226 of DQS signal 208 and falling edge 228 of bDQS signal 210. In response to rising edge 222 of HCLK signal 204, duty restore circuit 126 and data path and OCD circuit 132 provide falling edge 230 of DQS signal 208 and rising edge 232 of bDQS signal 210. In response to rising edge 244 of CLK signal 202, the process repeats to provide rising edge 234 of DQS signal 208 and falling edge 236 of bDQS signal 210. The duty cycle of DQS signal 208 is substantially 50%, and the duty cycle of bDQS signal 210 is substantially 50%.

Figure 4:
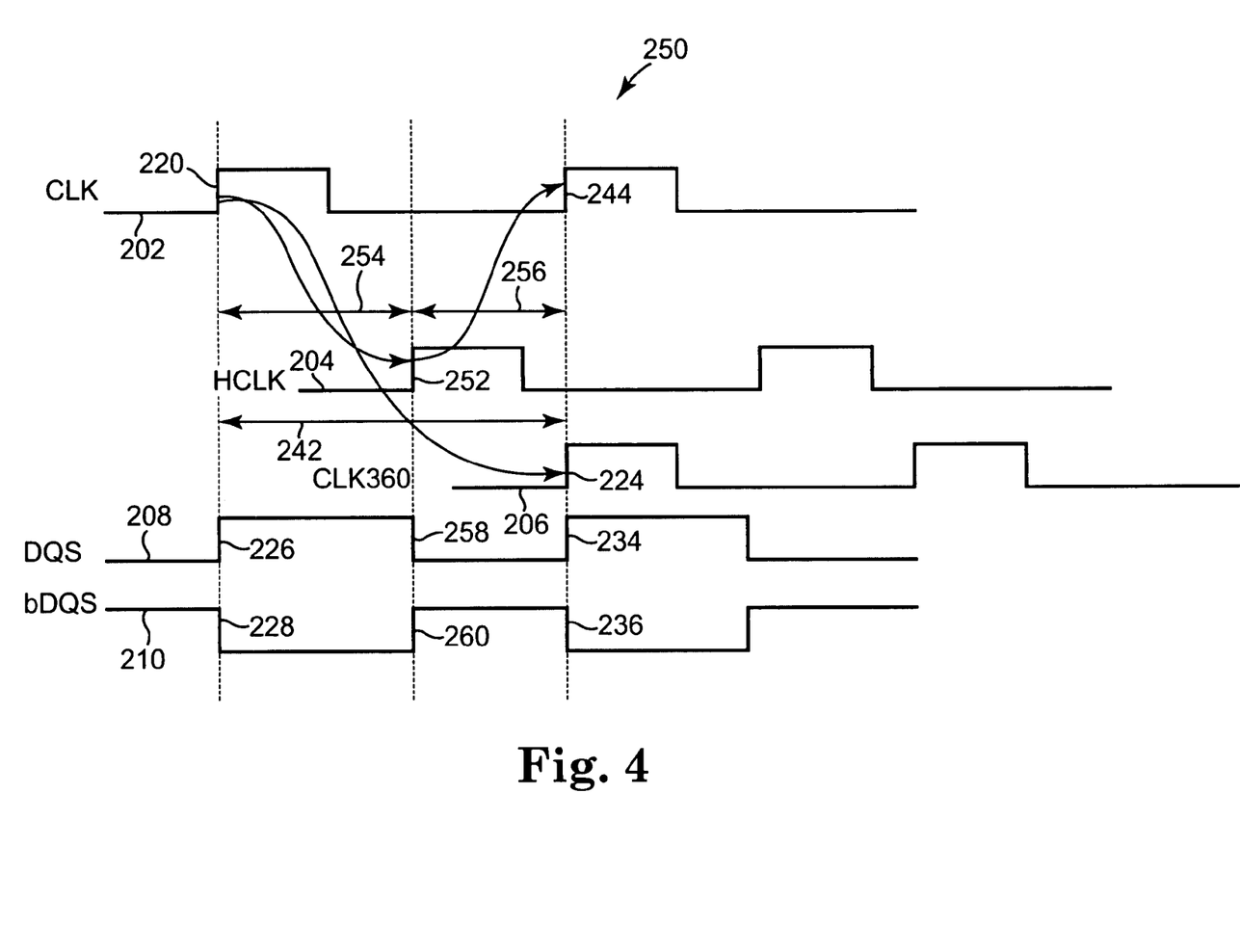
FIG. 4 is a timing diagram illustrating another embodiment of the timing of signals for the duty cycle corrector.

FIG. 4 is a timing diagram 250 illustrating another embodiment of the timing of signals for duty cycle corrector 108a. In this embodiment, however, due to random errors, the delay of controllable delay 120 is not substantially equal to the delay of controllable delay 124. In addition, the intrinsic delay of the CLK signal to generate the DQS signal and the intrinsic delay of the HCLK signal to generate the bDQS signal through duty restore circuit 126 and data path and OCD circuit 132 are not substantially equal. In another embodiment, the delay of controllable delay 120 is substantially equal to the delay of controllable delay 124, however, the intrinsic delay of the CLK signal to generate the DQS signal and the intrinsic delay of the HCLK signal to generate the bDQS signal through duty restore circuit 126 and data path and OCD circuit 132 are not substantially equal. In another embodiment, the delay of controllable delay 120 is not substantially equal to the delay of controllable delay 124, however, the intrinsic delay of the CLK signal to generate the DQS signal and the intrinsic delay of the HCLK signal to generate the bDQS signal through duty restore circuit 126 and data path and OCD circuit 132 are substantially equal. In any case, due to random errors, the total delays through the duty cycle corrector are not substantially equal.

Timing diagram 250 includes the same signals as illustrated in FIG. 3, including CLK signal 202 on CLK signal path 110, HCLK signal 204 on HCLK signal path 122, CLK360 signal 206 on CLK360 signal path 138, DQS signal 208 on DQS signal path 112, and bDQS signal 210 on bDQS signal path 114. The duty cycle of CLK signal 220 is less than 50%. Rising edge 220 of CLK signal 202 is delayed by controllable delay 120 to provide rising edge 252 of HCLK signal 204. The delay of controllable delay 120 is greater than one half cycle of CLK signal 202 as indicated at 254 due to errors. Rising edge 252 of HCLK signal 204 is delayed by controllable delay 124 to provide rising edge 224 of CLK360 signal 206. The delay of controllable delay 124 is less than one half of the cycle of CLK signal 202 as indicated at 256 due to errors. The delay of controllable delay 124 indicated at 254 is greater than the delay of controllable delay 120 indicated at 256.

The total delay between rising edge 220 of CLK signal 202 and rising edge 224 of CLK360 signal 206 remains one clock cycle as indicated at 242. Phase detector 134 adjusts controllable delay 120 and controllable delay 124 to phase lock CLK360 signal 206 to CLK signal 202 such that rising edge 224 of CLK360 signal 206 is aligned with rising edge 244 of CLK signal 220.

In response to rising edge 220 of CLK signal 202, duty restore circuit 126 and data path and OCD circuit 132 provide rising edge 226 of DQS signal 208 and falling edge 228 of bDQS signal 210. In response to rising edge 252 of HCLK signal 204, duty restore circuit 126 and data path and OCD circuit 132 provide falling edge 258 of DQS signal 208 and rising edge 260 of bDQS signal 210. In response to rising edge 244 of CLK signal 202, the process repeats to provide rising edge 234 of DQS signal 208 and falling edge 236 of bDQS signal 210. The duty cycle of DQS signal 208 is greater than 50%, and the duty cycle of bDQS signal 210 is less than 50% due to errors.

Figure 5:
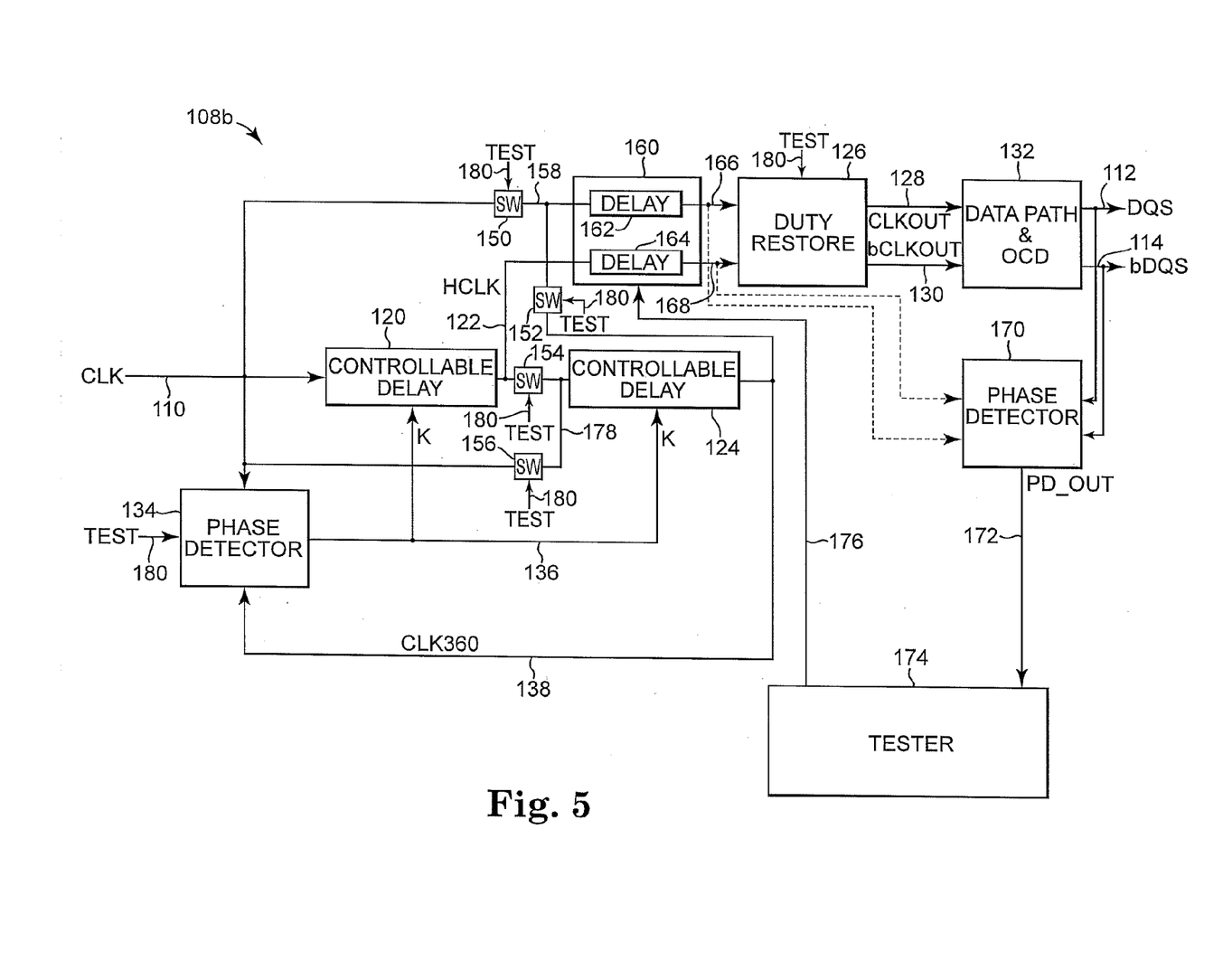
FIG. 5 is a block diagram illustrating another embodiment of a duty cycle corrector.

FIG. 5 is a block diagram illustrating another embodiment of a duty cycle corrector 108b. Duty cycle corrector 108b is similar to duty cycle corrector 108a previously described and illustrated with reference to FIG. 2, except duty cycle corrector 108b is configured for compensating for random errors that lead to DQS and bDQS signals having duty cycles greater than or less than 50%. Duty cycle corrector 108b includes two modes of operation including a test mode and a run mode. The test mode is used to adjust duty cycle corrector 108b to compensate for random errors during the run mode.

Duty cycle corrector 108b includes controllable delay 120, controllable delay 124, phase detector 134, compensation circuit 160 including delay circuit 162 and delay circuit 164, duty restore circuit 126, data path and OCD circuit 132, phase detector 170, tester 174, and switches 150, 152, 154, and 156. In one embodiment, switches 150 and 154 are p-channel metal-oxide-semiconductor (PMOS) field effect transistors (FETs) or other suitable switches, and switches 152 and 156 are n-channel metal-oxide-semiconductor (NMOS) FETs or other suitable switches.

A first side of switch 150, the input of controllable delay 120, a first input of phase detector 134, and one side of switch 156 receive the CLK signal on CLK signal path 110. The output of controllable delay 120 is electrically coupled to the input of delay circuit 164 and one side of switch 154 through HCLK signal path 122. The other side of switch 154 is electrically coupled to the input of controllable delay 124 and the other side of switch 156 through signal path 178. The control input of switch 154 and the control input of switch 156 receive a test (TEST) signal on TEST signal path 180. The output of controllable delay 124 is electrically coupled to one side of switch 152 and a second input of phase detector 134 through CLK360 signal path 138.

A control input of phase detector 134 receives the TEST signal on TEST signal path 180. The output of phase detector 134 is electrically coupled to the control input of controllable delay 120 and the control input of controllable delay 124 through K signal path 136. The other side of switch 150 is electrically coupled to the input of delay circuit 162 and the other side of switch 152 through signal path 158. The control input of switch 150 and the control input of switch 152 receive the TEST signal on TEST signal path 180. The output of delay circuit 162 is electrically coupled to a first input of duty restore circuit 126 through signal path 166. The output of delay circuit 164 is electrically coupled to a second input of duty restore circuit 126 through signal path 168.

A control input of duty restore circuit 126 receives the TEST signal on TEST signal path 180. A first output of duty restore circuit 126 is electrically coupled to a first input of data path and OCD circuit 132 through CLKOUT signal path 128. A second output of duty restore circuit 126 is electrically coupled to a second input of data path and OCD circuit 132 through bCLKOUT signal path 130. A first output of data path and OCD circuit 132 provides the DQS signal and is electrically coupled to a first input of phase detector 170 through DQS signal path 112. A second output of data path and OCD circuit 132 provides the bDQS signal and is electrically coupled to a second input of phase detector 170 through bDQS signal path 114. In another embodiment, the output of delay circuit 162 is directly electrically coupled to the first input of phase detector 170 in place of DQS signal path 112, and the output of delay circuit 164 is directly electrically coupled to the second input of phase detector 170 in place of bDQS signal path 114. The output of phase detector 170 is electrically coupled to an input of tester 174 through PD_OUT signal path 172. An output of tester 174 is electrically coupled to an input of compensation circuit 160 through signal path 176.

In the run mode of operation for duty cycle corrector 108b, the TEST signal is inactive. In one embodiment in the run mode of operation, the TEST signal is logic low. In response to a logic low TEST signal, switch 150 is closed to pass the CLK signal on CLK signal path 110 to signal path 158. In response to a logic low TEST signal, switch 154 is also closed to pass the HCLK signal on HCLK signal path 122 to signal path 178. In response to a logic low TEST signal, switch 152 is opened to block the CLK360 signal on CLK360 signal path 138 from passing to signal path 158. In response to a logic low TEST signal, switch 156 is also opened to block the CLK signal on CLK signal path 110 from passing to signal path 178.

In the test mode of operation for duty cycle corrector 108b, the TEST signal is active. In one embodiment in the test mode of operation, the TEST signal is logic high. In response to a logic high TEST signal, switch 150 is opened to block the CLK signal on CLK signal path 110 from passing to signal path 158. In response to a logic high TEST signal, switch 154 is also opened to block the HCLK signal on HCLK signal path 122 to from passing to signal path 178. In response to a logic high TEST signal, switch 152 is closed to pass the test mode CLK360 signal on CLK360 signal path 138 to signal path 158. In response to a logic high TEST signal, switch 156 is also closed to pass the CLK signal on CLK signal path 110 to signal path 178.

Controllable delay 120 delays the CLK signal on CLK signal path 110 to provide the HCLK signal on HCLK signal path 122. The HCLK signal is approximately 180 degrees out of phase with the CLK signal. The delay of controllable delay 120 is selected based on the K control signal input to controllable delay 120 on K signal path 136. Controllable delay 120 is any suitable type of variable delay, such as a series of inverters switched by the K control signal input.

In run mode, controllable delay 124 delays the HCLK signal passed through switch 154 to signal path 178 to provide the CLK360 signal on CLK360 signal path 138. The CLK360 signal is approximately 180 degrees out of phase with the HCLK signal. In test mode, controllable delay 124 delays the CLK signal passed through switch 156 to signal path 178 to provide the test mode CLK360 signal on CLK360 signal path 138. The delay of controllable delay 124 is selected based on the K control signal input to controllable delay 124 on K signal path 136. Controllable delay 124 is any suitable type of variable delay, such as a series of inverters switched by the K control signal input. In one embodiment, controllable delay 124 is similar to controllable delay 120.

Phase detector 134 receives the TEST signal on TEST signal path 180, the CLK signal on CLK signal path 110, and the CLK360 signal on CLK360 signal path 138 to provide the K control signal on K signal path 136. In run mode in response to a logic low TEST signal, phase detector 134 determines the phase difference between the CLK signal and the CLK360 signal to provide the K control signal on K signal path 136. In run mode, phase detector 134 provides the K control signal on K signal path 136 to adjust the delay of controllable delay 120 and the delay of controllable delay 124 such that the CLK360 signal is phase-locked to the CLK signal. In test mode in response to a logic high TEST signal, phase detector 134 provides a control signal on K signal path 136 based on a selected operating frequency, such as the highest operating frequency, for duty cycle corrector 108b in run mode. The highest operating frequency results in the largest errors within duty cycle corrector 108b.

Compensation circuit 160 receives a control signal on signal path 176 to adjust the delay of delay circuit 162 and the delay of delay circuit 164. In run mode, delay 162 delays the CLK signal passed through switch 150 to signal path 158 to provide the signal on signal path 166. In test mode, delay circuit 162 delays the test mode CLK360 signal passed through switch 152 to signal path 158 to provide the signal on signal path 166. In both run mode and test mode, delay circuit 164 delays the HCLK signal on HCLK signal path 122 to provide the signal on signal path 168. In one embodiment, the delay of delay circuit 162 and the delay of delay circuit 164 are permanently set based on the control signal on signal path 176 through fusing.

Duty restore circuit 126 receives the signal on signal path 166, the signal on signal path 168, and the TEST signal on TEST signal path 180 to provide the CLKOUT signal on CLKOUT signal path 128 and the bCLKOUT signal on bCLKOUT signal path 130. In run mode in response to a logic low TEST signal, in response to a rising edge of the signal on signal path 166, duty restore circuit 126 transitions the CLKOUT signal from logic low to logic high and transitions to bCLKOUT signal from logic high to logic low. In response to a rising edge of the signal on signal path 168, duty restore circuit 126 transitions the CLKOUT signal from logic high to logic low and transitions the bCLKOUT signal from logic low to logic high. The bCLKOUT signal is the inverse of the CLKOUT signal. In test mode in response to a logic high TEST signal, duty restore circuit 126 passes the signal on signal path 166 to provide the test mode CLKOUT signal on CLKOUT signal path 128 and passes the signal on signal path 168 to provide the test mode bCLKOUT signal on bCLKOUT signal path 130. In another embodiment, where the outputs of compensation circuit 160 are directly electrically coupled to phase detector 170, in test mode in response to a logic high TEST signal, duty restore circuit 126 is disabled.

In run mode, data path and OCD circuit 132 receives the CLKOUT signal on CLKOUT signal path 128 and the bCLKOUT signal on bCLKOUT signal path 130 to provide the DQS signal on DQS signal path 112 and the bDQS signal on bDQS signal path 114. Data path and off chip driver circuit 132 includes drivers for generating the DQS and bDQS signals in response to the CLKOUT and bCLKOUT signals. Data path and off chip driver circuit 132 includes intrinsic delays. In test mode, data path and OCD circuit 132 receives the test mode CLKOUT signal on CLKOUT signal path 128 and the test mode bCLKOUT signal on bCLKOUT signal path 130 to provide the test mode DQS signal on DQS signal path 112 and the test mode bDQS signal on bDQS signal path 114. In another embodiment, where the outputs of compensation circuit 160 are directly electrically coupled to phase detector 170, in test mode data path and OCD circuit 132 is disabled.

In run mode, phase detector 170 is not used. In test mode, phase detector 170 receives the test mode DQS signal on DQS signal path 112 and the test mode bDQS signal on bDQS signal path 114 to provide the PD_OUT signal on PD_OUT signal path 172. Phase detector 170 determines the phase difference between the test mode DQS signal and the test mode bDQS signal to provide a phase difference signal on PD_OUT signal path 172. In one embodiment, phase detector 170 is part of an external circuit that is electrically coupled to DQS signal path 112 and bDQS signal path 114 in test mode and decoupled from DQS signal path 112 and bDQS signal path 114 in run mode. In another embodiment, phase detector 170 is part of the same semiconductor chip as the remaining parts of duty cycle corrector 108b and is permanently electrically coupled to DQS signal path 112 and bDQS signal path 114.

In another embodiment, where the outputs of compensation circuit 160 are directly electrically coupled to phase detector 170, phase detector 170 receives the test mode signal on signal path 166 and the test mode signal on signal path 168. Phase detector 170 determines the phase difference between the test mode signal on signal path 166 and the test mode signal on signal path 168 to provide a phase difference signal on PD_OUT signal path 172. In one embodiment, phase detector 170 is part of an external circuit that is electrically coupled to signal path 166 and signal path 168 in test mode and decoupled from signal path 166 and signal path 168 in run mode. In another embodiment, phase detector 170 is part of the same semiconductor chip as the remaining parts of duty cycle corrector 108b and is permanently electrically coupled to signal path 166 and signal path 168.

In run mode, tester 174 is not used. In test mode, tester 174 receives the PD_OUT signal on PD_OUT signal path 172 to provide a control signal on signal path 176. In response to the PD_OUT signal, tester 174 provides a control signal to compensation circuit 160 to adjust the delay of delay circuit 162 and/or the delay of delay circuit 164 to phase lock the test mode DQS signal to the test mode bDQS signal or the signal on signal path 166 to the signal on signal path 168. In one embodiment, tester 174 is part of an external circuit that is electrically coupled to PD_OUT signal path 172 in test mode and decoupled from PD_OUT signal path 172 in run mode. In another embodiment, tester 174 is part of the same semiconductor chip as the remaining parts of duty cycle corrector 108b and is permanently electrically coupled to PD_OUT signal path 172 and signal path 176.

In operation in test mode with the TEST signal logic high, switches 150 and 154 are open and switches 152 and 156 are closed. Phase detector 134 provides a constant K signal to set controllable delay 120 and controllable delay 124 for the selected operating frequency of the CLK signal. The CLK signal is delayed by both controllable delay 120 and controllable delay 124. Initially, the delay of delay circuit 162 and the delay of delay circuit 164 are set to no delay. The two delayed CLK signals provide the test mode signal on signal path 166 and the test mode signal on signal path 168 and pass through duty restore circuit 126 and data path and OCD circuit 132 to provide the test mode DQS signal and the test mode bDQS signal.

Phase detector 170 determines the phase difference between the test mode DQS signal and the test mode bDQS signal or the test mode signal on signal path 166 and the test mode signal on signal path 168. Phase detector 170 passes the phase difference to tester 174. Tester 174 adjusts the delay of delay circuit 162 and the delay of delay circuit 164 to adjust the test mode DQS signal and/or the test mode bDQS signal to be in phase with each other or to adjust the test mode signal on signal path 166 and/or the test mode signal on signal path 168 to be in phase with each other. In one embodiment, the delay of delay circuit 162 and the delay of delay circuit 164 are permanently set through fusing. In this way, compensation circuit 160 compensates for a delay mismatch between controllable delay 120 and controllable delay 124 and/or a mismatch between signal paths through duty restore circuit 126 and data path and OCD circuit 132.

In operation in run mode with the TEST signal logic low, switches 150 and 154 are closed and switches 152 and 156 are open. The CLK signal is delayed by controllable delay 120 to provide the HCLK signal. The HCLK signal is delayed by controllable delay 124 to provide the CLK360 signal. The CLK signal and CLK360 signals are input to phase detector 134. Phase detector 134 compares the CLK signal to the CLK360 signal to determine the phase difference between the CLK signal and the CLK360 signal. Phase detector 134 provides the K control signal to controllable delay 120 and controllable delay 124 to adjust the delay of controllable delay 120 and the delay of controllable delay 124 to phase lock the CLK360 signal to the CLK signal.

Delay circuit 162 delays the CLK signal to provide the signal on signal path 166. Delay circuit 164 delays the HCLK signal to provide the signal on signal path 168. Compensation circuit 160 compensates for a delay mismatch between controllable delay 120 and controllable delay 124 and/or a mismatch between signal paths through duty restore circuit 126 and data path and OCD circuit 132. In response to the signal on signal path 166 and the signal on signal path 168, duty restore circuit 126 provides the CLKOUT signal having a duty cycle of substantially 50% and the bCLKOUT signal having a duty cycle of substantially 50%. In response to the CLKOUT signal and the bCLKOUT signal, data path and OCD circuit 132 generates the DQS and bDQS signals. The DQS and bDQS signals have duty cycles of substantially 50%.

Figure 6:
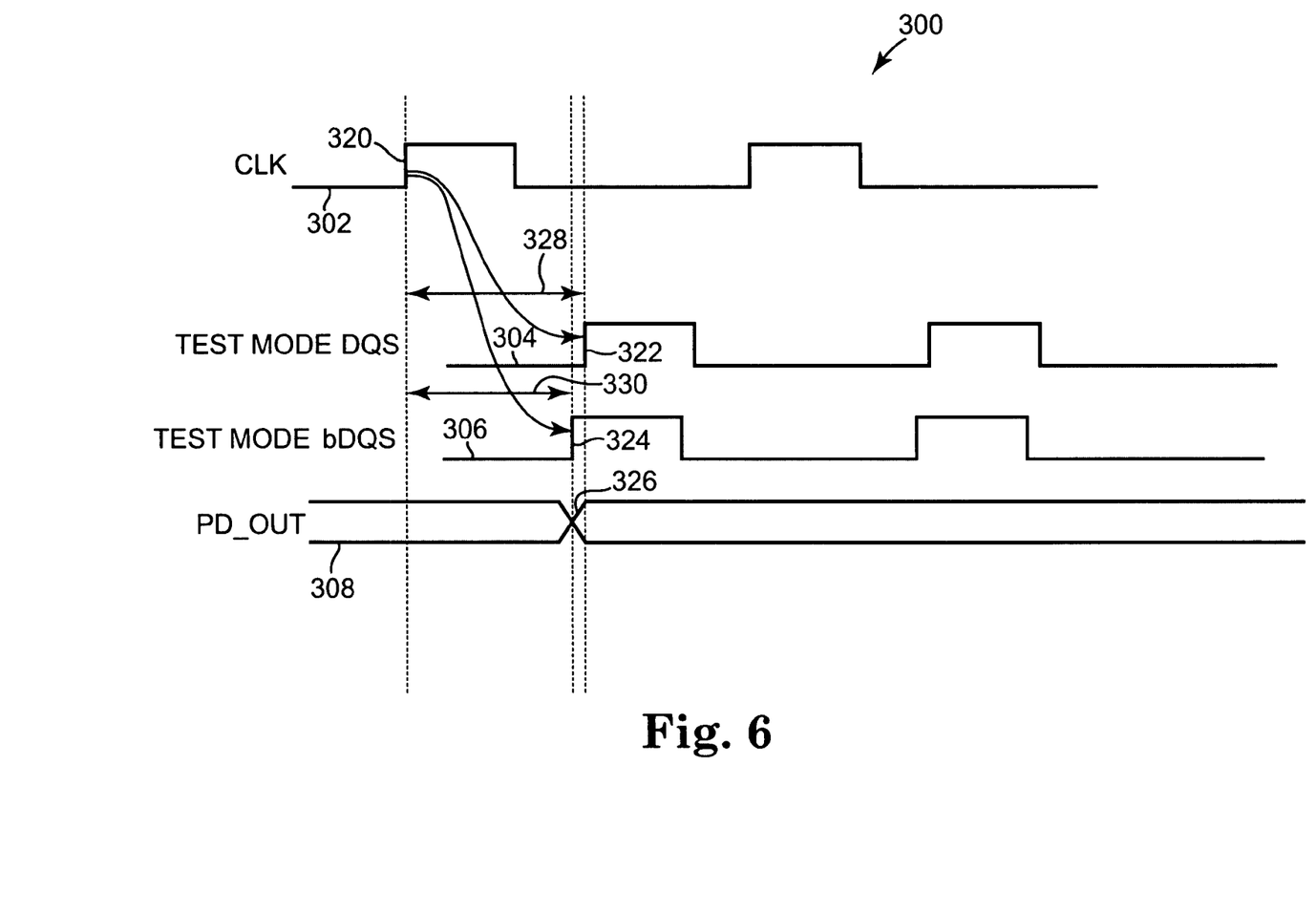
FIG. 6 is a timing diagram illustrating one embodiment of the timing of signals for the duty cycle corrector in test mode.

FIG. 6 is a timing diagram 300 illustrating the timing of signals for duty cycle corrector 108b in test mode. Timing diagram 300 includes CLK signal 302 on CLK signal path 110, test mode DQS signal 304 on DQS signal path 112, test mode bDQS signal 306 on bDQS signal path 114, and PD_OUT signal 308 on PD_OUT signal path 172. Rising edge 320 of CLK signal 302 is delayed by controllable delay 120, delay circuit 164, duty restore circuit 126, and data path and OCD circuit 132 to provide rising edge 322 of test mode DQS signal 304. The delay through controllable delay 120, delay circuit 164, duty restore circuit 126, and data path and OCD circuit 132 for test mode DQS signal 304 is indicated at 328. Rising edge 320 of CLK signal 302 is delayed by controllable delay 124, delay circuit 164, duty restore circuit 126, and data path and OCD circuit 132 to provide rising edge 324 of test mode bDQS signal 306. The delay of through controllable delay 124, delay circuit 164, duty restore circuit 126, and data path and OCD circuit 132 for test mode bDQS signal 306 is indicated at 330.

In response to rising edge 322 of test mode DQS signal 304 and rising edge 324 of test mode bDQS signal 306, phase detector 170 provides the phase difference as indicated at 326 on PD_OUT signal 308. Based on this phase difference, the delays of compensation circuit 160 are set to align rising edge 322 of test mode DQS signal 304 with rising edge 324 of test mode bDQS signal 306. Therefore, when operating in run mode, duty cycle corrector 108b provides a DQS signal and bDQS signal having duty cycles of substantially 50% as illustrated in timing diagram 200 of FIG. 3.

Embodiments of the present invention provide a duty cycle corrector for compensating for a mismatch between controllable delays and/or for compensating for a mismatch between signal paths through a duty restore circuit and data path and off chip driver circuit. A one time process is used to program a compensation delay circuit in the signal paths for the worst case operating frequency to provide the DQS and bDQS signals having duty cycles of substantially 50%.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A duty cycle corrector comprising:
a first controllable delay configured to delay a first signal to provide a second signal;
a second controllable delay configured to delay the second signal to provide a third signal;
a phase detector configured to adjust the first controllable delay and the second controllable delay to phase lock the third signal to the first signal; and
a compensation circuit configured to compensate for a mismatch between the first controllable delay and the second controllable delay to provide a fourth signal in response to the first signal and a fifth signal approximately 180 degrees out of phase with the fourth signal in response to the second signal;
wherein the compensation circuit comprises a first delay circuit configured to delay the first signal to provide the fourth signal and a second delay circuit configured to delay the second signal to provide the fifth signal, and
wherein a delay of the first delay circuit and a delay of the second delay circuit are set based on a phase difference between a test mode signal delayed by the first controllable delay and the second delay circuit and the test mode signal delayed by the second controllable delay and the first delay circuit.

2. The duty cycle corrector of claim 1, wherein the delay of the first delay circuit and the delay of the second delay circuit are set based on a phase difference between a test mode signal delayed by the first controllable delay, the second delay circuit, a duty restore circuit, and a data path and off chip driver circuit and the test mode signal delayed by the second controllable delay, the first delay circuit, the duty restore circuit, and the data path and off chip driver circuit.

3. The duty cycle corrector of claim 1, further comprising:
a duty restore circuit configured to provide a sixth signal and a seventh signal inverse to the sixth signal in response to the fourth signal and the fifth signal, the sixth signal and the seventh signal having duty cycles of substantially 50%.

4. The duty cycle corrector of claim 3, further comprising:
a data path and off chip driver circuit configured to provide a data strobe signal and an inverted data strobe signal in response to the sixth signal and the seventh signal.

5. A duty cycle corrector comprising:
a first controllable delay configured to delay a first signal to provide a second signal;
a second controllable delay configured to delay the second signal to provide a third signal in a run mode and delay the first signal to provide a fourth signal in a test mode;
a first phase detector configured to adjust the first controllable delay and the second controllable delay to phase lock the third signal to the first signal in the run mode and adjust the first controllable delay and the second controllable delay for a selected operating frequency in the test mode;
a compensation circuit configured to compensate for a mismatch between the first controllable delay and the second controllable delay to provide a fifth signal in response to the first signal and a sixth signal in response to the second signal in the run mode and provide a seventh signal in response to the second signal and an eighth signal in response to the fourth signal in the test mode; and
a second phase detector configured to determine a phase difference between the seventh signal and the eighth signal in the test mode for adjusting the compensation circuit to bring the seventh signal and the eighth signal in phase with each other.

6. The duty cycle corrector of claim 5, wherein the compensation circuit comprises a first delay circuit configured to delay the first signal to provide the fifth signal and a second delay circuit configured to delay the second signal to provide the sixth signal in the run mode.

7. The duty cycle corrector of claim 5, further comprising:
a tester configured to adjust the compensation circuit based on the phase difference between the seventh signal and the eighth signal.

8. A duty cycle corrector comprising:
means for delaying a first signal to provide a second signal;
means for delaying the second signal to provide a third signal;
means for adjusting the means for delaying the first signal and the means for delaying the second signal to phase lock the third signal to the first signal; and
means for compensating for a mismatch between the means for delaying the first signal and the means for delaying the second signal to provide a fourth signal in response to the first signal and a fifth signal approximately 180 degrees out of phase with the fourth signal in response to the second signal;
wherein the means for compensating comprises means for delaying the first signal to provide the fourth signal and means for delaying the second signal to provide the fifth signal, and
wherein a delay of the means for delaying the first signal to provide the fourth signal, and a delay of the means for delaying the second signal to provide the fifth signal are set based on a phase difference between a test mode signal delayed by the means for delaying the first signal to provide the second signal and means for delaying the second signal to provide the fifth signal and the test mode signal delayed by the means for delaying the second signal to provide the third signal and means for delaying the first signal to provide the fourth signal.

9. The duty cycle corrector of claim 8, further comprising:
means for providing a sixth signal and a seventh signal inverse to the sixth signal in response to the fourth signal and the fifth signal, the sixth signal and the seventh signal having duty cycles of substantially 50%.

10. The duty cycle corrector of claim 9, further comprising:
means for providing a data strobe signal and an inverted data strobe signal in response to the sixth signal and the seventh signal.

11. A method of correcting the duty cycle of a first signal, the method comprising:
delaying the first signal to provide a second signal by a first controllable delay;
delaying the second signal to provide a third signal by a second controllable delay;

adjusting the delay of the first signal and the delay of the second signal to phase lock the third signal to the first signal; and compensating for a mismatch between the delay of the first signal and the delay of the second signal to provide a fourth signal in response to the first signal and a fifth signal approximately 180 degrees out of phase with the fourth signal in response to the second signal;

wherein compensating for the mismatch comprises delaying the first signal to provide the fourth signal by a first delay and delaying the second signal to provide the fifth signal, by a second delay and wherein a delay of the first signal to provide the fourth signal and a delay of the second signal to provide the fifth signal are set based on a phase difference between a test mode signal delayed by the first controllable delay and the second delay and the test mode signal delayed by the second controllable delay and the first delay.

12. The method of claim 11, further comprising:
providing a sixth signal and a seventh signal inverse to the sixth signal in response to the fourth signal and the fifth signal, the sixth signal and the seventh signal having duty cycles of substantially 50%.

13. The method of claim 12, further comprising:
providing a data strobe signal and an inverted data strobe signal in response to the sixth signal and the seventh signal.

14. A method of correcting the duty cycle of a first signal, the method comprising:
delaying the first signal to provide a second signal;
delaying the second signal to provide a third signal in a run mode and delaying the first signal to provide a fourth signal in a test mode;
adjusting the delay of the first signal providing the second signal and the delay of the second signal to phase lock the third signal to the first signal in the run mode and setting the delay of the first signal providing the second signal and the delay of the first signal providing the fourth signal for a selected operating frequency in the test mode;
compensating for a mismatch between the delay of the first signal providing the second signal and the delay of the second signal to provide a fifth signal in response to the first signal and a sixth signal in response to the second signal in the run mode and provide a seventh signal in response to the second signal and an eighth signal in response to the fourth signal in the test mode;
determining a phase difference between the seventh signal and the eighth signal in the test mode; and
adjusting the compensation circuit to bring the seventh signal and the eighth signal in phase with each other in the test mode based on the phase difference.

15. The duty cycle corrector of claim 14, wherein compensating for the mismatch comprises delaying the first signal to provide the fifth signal and delaying the second signal to provide the sixth signal in the run mode.

16. An electronic system comprising:
a host; and
a memory including a duty cycle corrector configured to receive a clock signal from the host,
wherein the duty cycle corrector comprises:
a first controllable delay configured to delay the clock signal to provide a second signal;
a second controllable delay configured to delay the second signal to provide a third signal;
a phase detector configured to adjust the first controllable delay and the second controllable delay to phase lock the third signal to the clock signal; and
a compensation circuit configured to compensate for a mismatch between the first controllable delay and the second controllable delay to provide a fourth signal in response to the clock signal and a fifth signal approximately 180 degrees out of phase with the fourth signal in response to the second signal;
wherein the compensation circuit comprises a first delay circuit configured to delay the first signal to provide the fourth signal and a second delay circuit configured to delay the second signal to provide the fifth signal, and
wherein a delay of the first delay circuit and a delay of the second delay circuit are set based on a phase difference between a test mode signal delayed by the first controllable delay and the second delay circuit and the test mode signal delayed by the second controllable and the first delay circuit delay.

17. The system of claim 16, wherein the memory comprises a dynamic random access memory.

* * * * *